United States Patent [19]

Jibbe

[11] Patent Number: 4,802,221

[45] Date of Patent: Jan. 31, 1989

[54] DIGITAL SYSTEM AND METHOD FOR COMPRESSING SPEECH SIGNALS FOR STORAGE AND TRANSMISSION

[75] Inventor: Mahmoud K. Jibbe, Wichita, Kans.

[73] Assignee: NCR Corporation, Dayton, Ohio

[21] Appl. No.: 887,492

[22] Filed: Jul. 21, 1986

[51] Int. Cl.$^4$ .............................................. G10L 5/00
[52] U.S. Cl. .......................................... 381/34; 381/30
[58] Field of Search ................................... 381/29-53

[56] References Cited

U.S. PATENT DOCUMENTS

| | | | |
|---|---|---|---|
| 3,916,105 | 10/1975 | McCray | 179/1.5 D |
| 4,015,088 | 3/1977 | Dubnowski et al. | 381/49 |
| 4,412,306 | 10/1983 | Moll | 364/900 |
| 4,653,098 | 3/1987 | Nakata et al. | 381/49 |

OTHER PUBLICATIONS

IEEE Transactions on Acoustics, Speech and Signal Processing, vol. ASSP-31, No. 1, Feb. 1983, IEEE (New York, U.S.), K. Inoue et al.: "A Single CMOS Speech Synthesis Chip and New Synthesis Techniques", pp. 335-338.

IEEE Transactions on Acoustics, Speech and Signal Processing, vol. ASSP-28, No. 4, Aug. 1980, IEEE (New York, U.S.) C. K. Un et al.: "Voiced/Unvoiced/Silence Discrimination of Speech by Delta Modulation", pp. 398-407.

IEEE Transactions on Communications, vol. COM-30, No. 2, Feb. 1982, (New York, U.S.), J. A. Flanagan et al.: "Digital Voice Storage in a Microprocessor", pp. 336-345.

International Conference on Communications, Seattle, Washington, Jun. 11-13, 1973, IEEE (New York, U.S.), A. H. Frei et al.: "Adaptive Predictive Speech Coding Based on Pitch-Controlled Interruption/Reiteration Techniques", pp. 46-12-46-16.

IEEE Transactions on Acoustics, Speech & Signal Processing, vol. ASSP-25, No. 6, Dec. 1977, IEEE (New York, U.S.), N. C. Geckinli et al.: "Algorithm for Pitch Extraction Using Zero-Crossing Interval Sequence", pp. 559-564.

The Journal of the Acoustical Society of America, vol. 46, No. 2, Part 2, 1969 (New York, U.S.), B. Gold et al.: "Parallel Processing Techniques for Estimating Pitch Periods of Speech in the Time Domain", pp. 442-448.

*Primary Examiner*—Emanuel S. Kemeny
*Attorney, Agent, or Firm*—Wilbert Hawk, Jr.; Edward Dugas

[57] ABSTRACT

The system and method of the invention operates upon a serial bit stream of speech encoded data by reading the data in fixed length frames. Each frame is classified as to whether the frame represents voiced, unvoiced, or a silence condition. For a voiced frame, the pitches are detected. The bits of the voiced frame are then compared with the bits of prior received voiced frames, on a pitch basis, so as to detect repetition. When repetition is detected, the repetition count, the pitch period, and the one set of the repetitive pitch bits are stored ready for transmission. The compressed data is reconstructed by utilizing a decoder which interprets the stored information and causes reinsertion of the repetitions.

10 Claims, 17 Drawing Sheets

X1 = UNVOICED THRESHOLD LEVEL
X2 = SILENCE THRESHOLD LEVEL

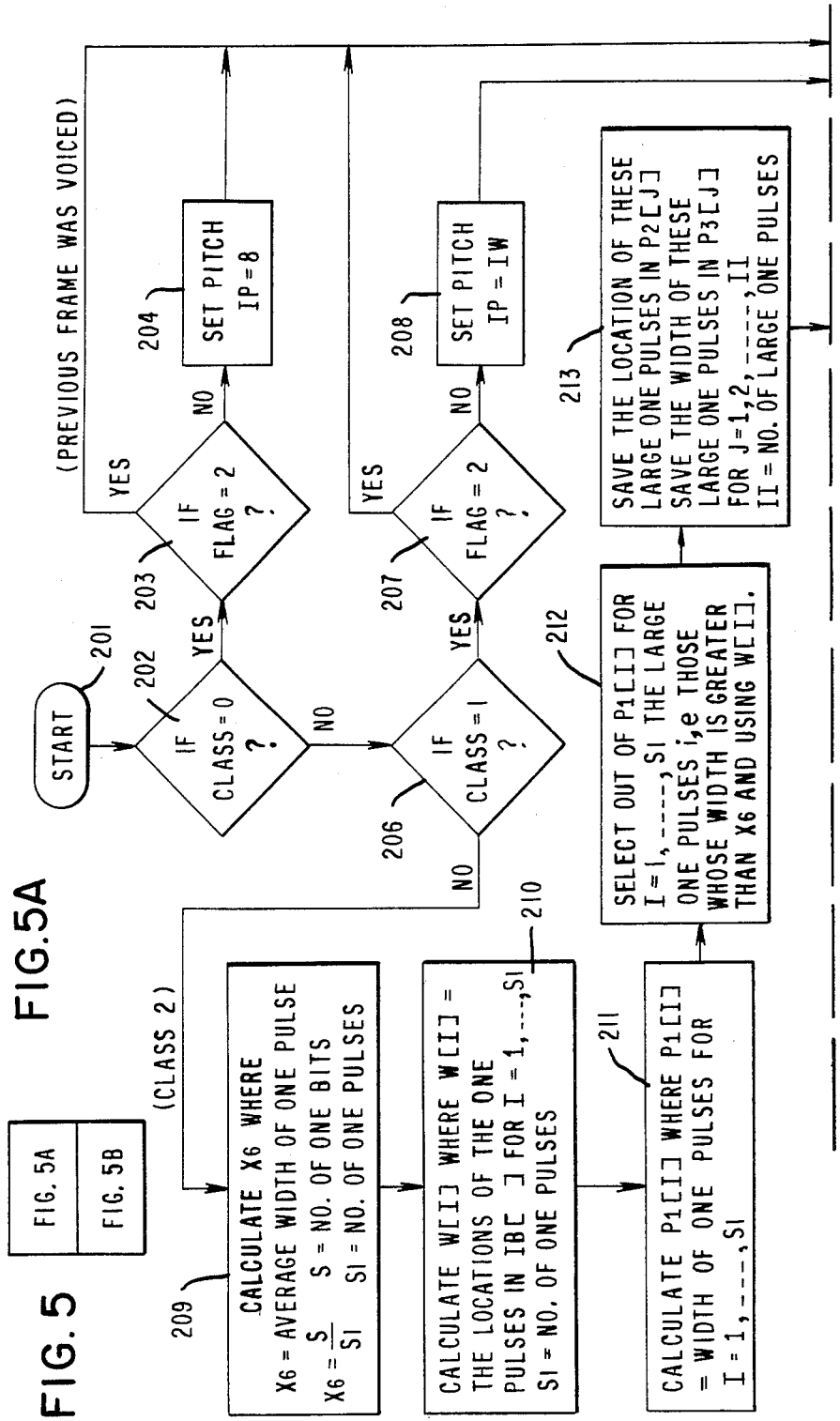

FIG. 6

| REPETITION COUNT | NUMBER OF BITS IN THE DATA FIELD | DATA FIELD |
|---|---|---|
| BYTE NO.1 | BYTE NO.2 | BYTE NO.3 — BYTE NO.n | a) GENERAL FORM OF COMPRESSED DATA BLOCK.
   n = 3 + MAX. INTEGER OF IP/8

| $\frac{IW}{8}$ | 8 | b1 b2 b3 b4 b5 b6 b7 b8 (DESCRIBED IN FIG. 7A) |
|---|---|---| b) COMPRESSED DATA BLOCK OF SILENT FRAME.

| 1 | IW | UNVOICED DATA i,e IB[I] FOR I=1,2,---,IW |
|---|---|---| c) COMPRESSED DATA BLOCK OF UNVOICED FRAME.

| REPETITION COUNT "N" | PITCH PERIOD "IP" | REPETITIVE PITCH PERIOD DATA RP[I] FOR I=1,---,IP (DESCRIBED IN FIG.7C) |
|---|---|---| d) COMPRESSED DATA BLOCK OF VOICED FRAME.

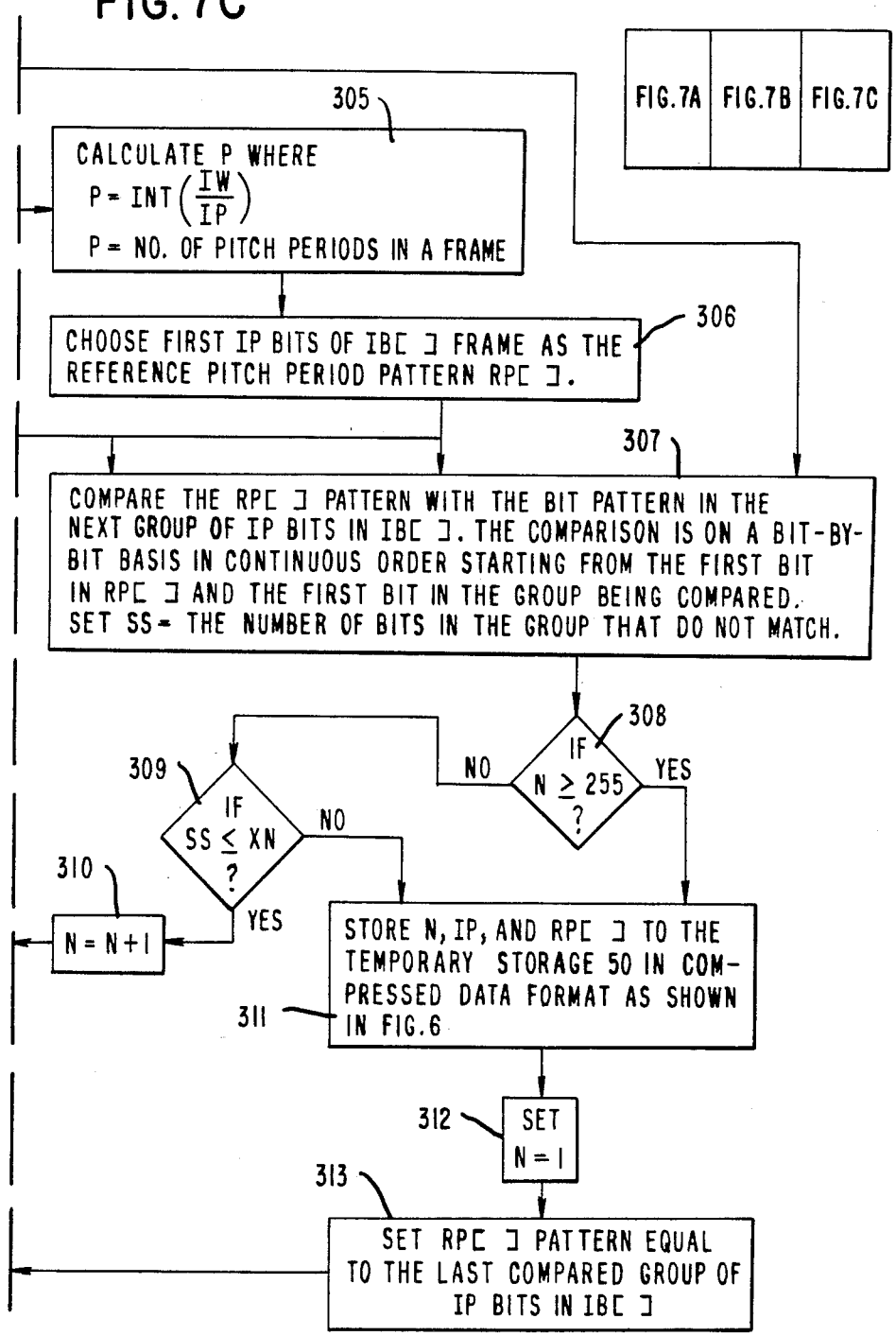
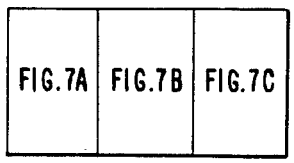
FIG. 7C
FIG. 7

FIG. 9A  SPEECH WAVEFORM OF THE WORD "STAY"
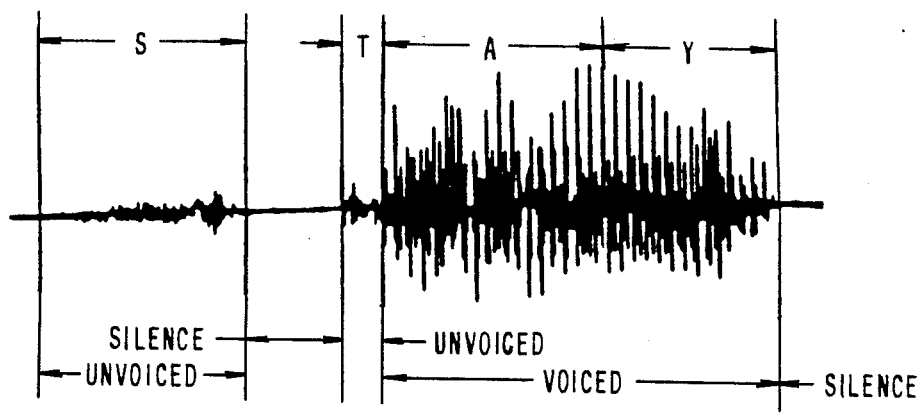
FIG. 9B  SPFE DIGITAL OUTPUT OF THE WORD "STAY"
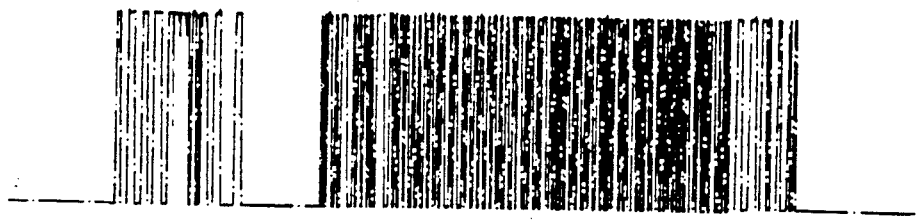
FIG. 9C  CVSD DIGITAL OUTPUT OF THE WORD "STAY"
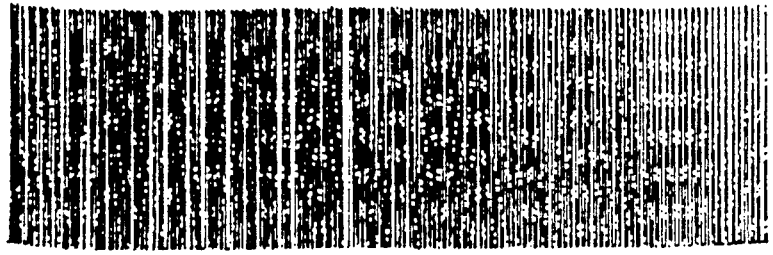
FIG. 9D  MIMIC DIGITAL OUTPUT OF THE WORD "STAY"
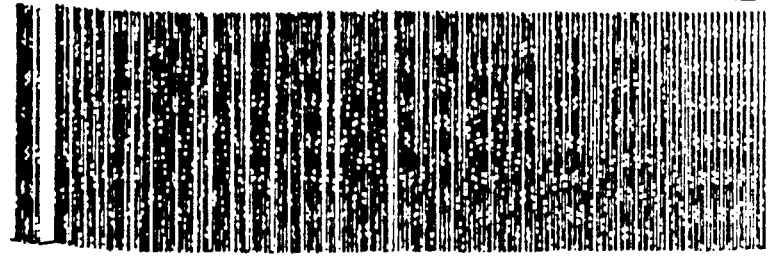

FIG. 10A  SPFE: SILENT FRAME
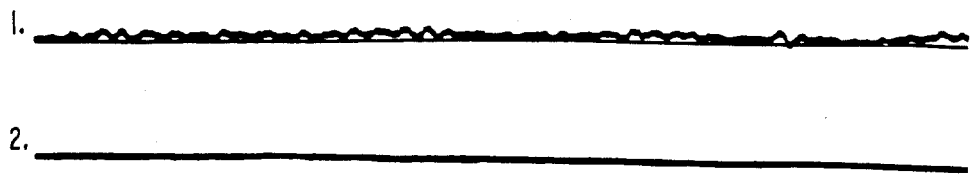
FIG. 10B  SPFE: UNVOICED FRAME
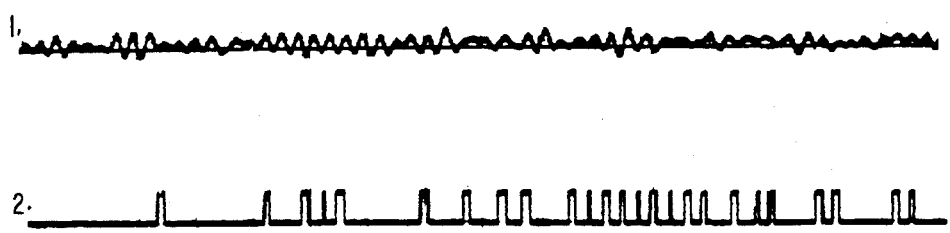
FIG. 10C  SPFE: VOICED FRAME
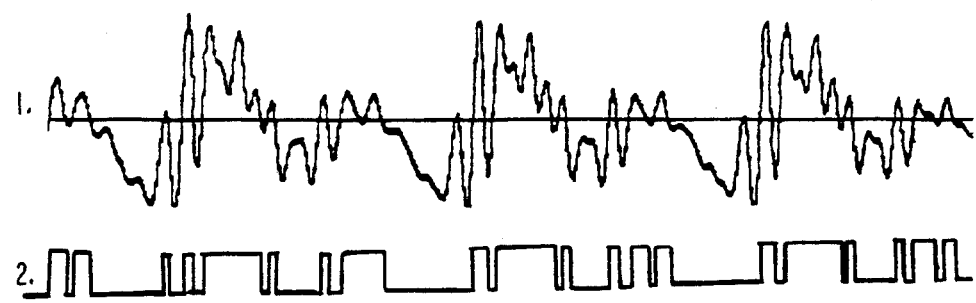

FIG. 11A   CVSD: SILENT FRAME
1. 
2. 
FIG. 11B   CVSD: UNVOICED FRAME
1. 
2. 
FIG. 11C   CVSD: VOICED FRAME
1. 
2. 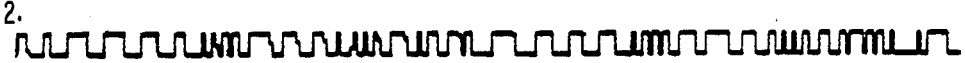

FIG. 12A  MIMIC: SILENT FRAME
FIG. 12B  MIMIC: UNVOICED FRAME
FIG. 12C  MIMIC: VOICED FRAME
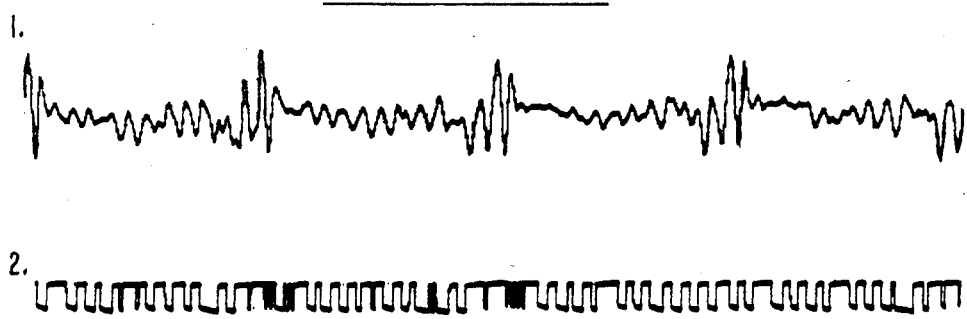

FIG. 13A PITCH DETECTION OF A SPFE'S VOICED FRAME
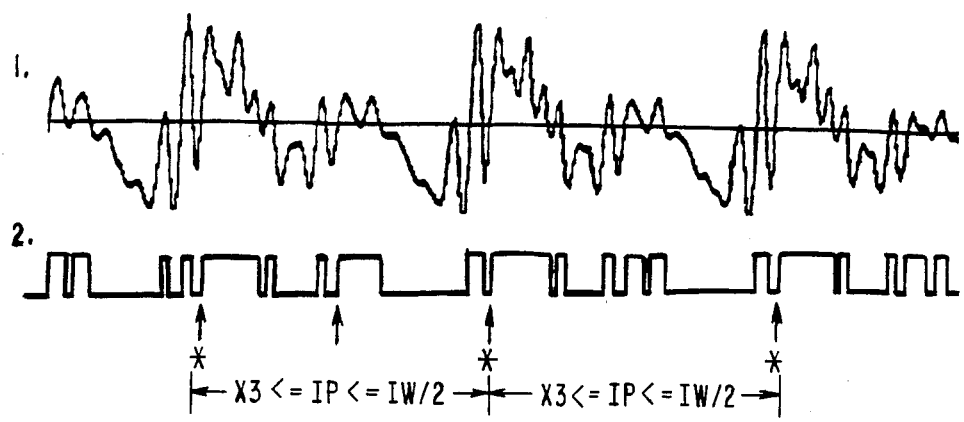
FIG. 13B PITCH DETECTION OF A CVSD'S VOICED FRAME
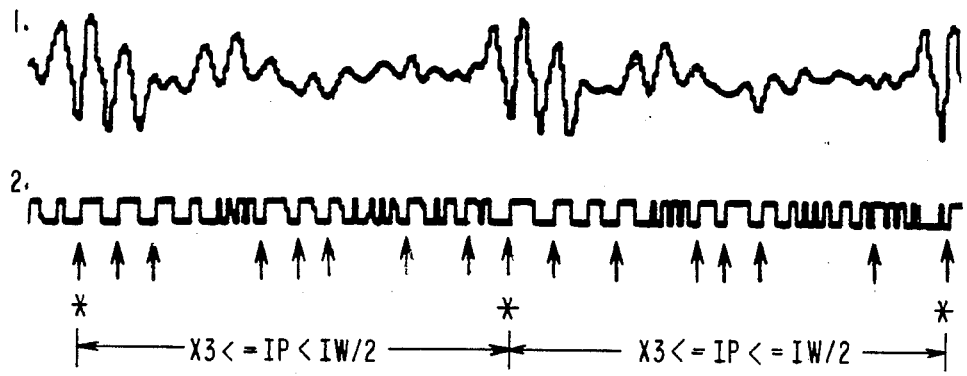
FIG. 13C PITCH DETECTION OF A MIMIC'S VOICED FRAME
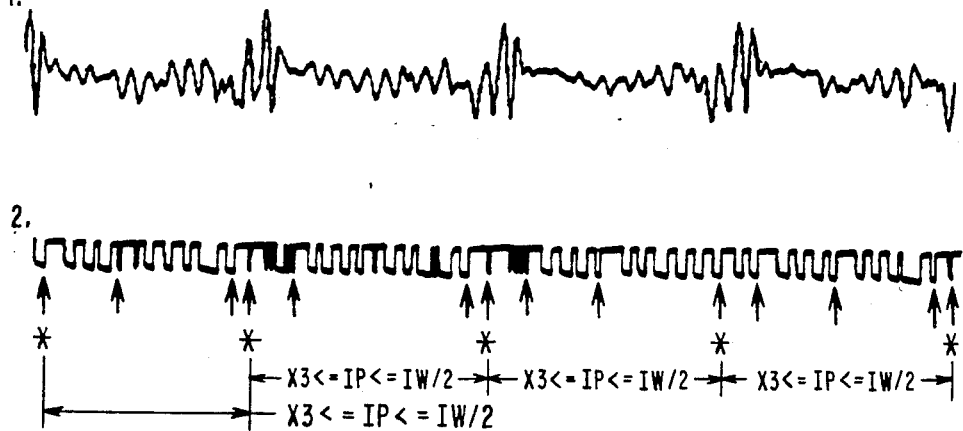

DIGITAL SYSTEM AND METHOD FOR COMPRESSING SPEECH SIGNALS FOR STORAGE AND TRANSMISSION

BACKGROUND OF THE INVENTION

1. Field of the Invention

This present invention relates generally to the field of data-compression of digitally encoded speech signals and more particularly to a system and a method for compressing the serial bit stream signals that are generated by delta modulation encoders, such as CVSD (continuous variable slope modulation) encoders, and by sampled clipped speech encoders 2. Description of Related Art A patent of interest for its teaching of analog to digital conversion of speech signals is U.S. Pat. No. 4,271,332 entitled "Speech Signal A/D Converter Using an Instantaneously-Variable Band Width Filter", by J. C. Anderson.

The signal technique described in this patent is denoted the MIMIC technique which will be referred to in the Description of The Preferred Embodiment A patent of interest for its teaching of processing sampled clipped speech signals is U.S. Pat. No. 4,594,575 entitled "Improved Digital Processor for Speech Signals" by Avery et al. The type of processor described in this patent will be denoted SPFE, an acronym for Speech Processor Front-End. The acronym will be used in the Description of The Preferred Embodiment.

Machines that talk have been popular for many years, for they take on almost human characteristics in questioning and response.

Although many speech-synthesis products exists, their characteristics differ widely and are influenced by many factors such as speech-encoding methods, bit rate, and vocabulary preparation.

From the different sound and tonal inflections that accompany the spoken word, it is obvious that speech properties change during the transition from voiced to unvoiced speech. For example, there are large changes in peak amplitude and fundamental frequency, but because waveforms change little for short segments of speech, most speech-processing techniques, which intend to achieve a low bit rate, isolate such segments and process them as if they were short segments of sustained sound having fixed properties. This segment action which is usually referred to as framing, introduces a distortion in the reconstruction of speech. This distortion degrades the speech quality and intelligibility. For this reason and others, most of the low bit rate speech processors sound mechanical.

The need for deciding whether a given segment of a speech waveform should be classified as voiced speech, unvoiced speech, or silence (absence of speech) arises in many speech analysis systems. Most of the available methods work in conjunction with pitch analysis to decide what class the segment should fall into. There are two disadvantages in this approach to the voiced- unvoiced decision. First, the decision is based on a single feature—the degree of voice periodicity. Voiced speech is only approximately periodic; sudden changes in articulation and the idiosyncrasies of vocal cord vibrations can produce speech waveforms which are not periodic. In such cases, a feature such as the amplitude of the largest cepstral peak will fail to distinguish voiced speech from unvoiced. Second, the voiced-unvoiced decision is tied to the pitch detection which may be acceptable for speech synthesis applications, but for the proposed application, the linking of the voiced- unvoiced decision to pitch detection can result in unnecessary complexity as well as in poorer performance, particularly at the boundaries between voiced and unvoiced speech.

Pitch (i.e., fundamental frequency $F_0$ and fundamental period $T_0$) occupies a key position in the acoustic speech signal. The prosodic information of an utterance is predominantly determined by this parameter. The ear is more sensitive to changes of fundamental frequency than to changes of other speech signal parameters by an order of magnitude. The quality of voiced speech is essential influenced by the quality and faultlessness of the pitch measurement. The importance of this parameter thus necessitates using a good and reliable measurement method. The prior art shows that pitch detection can roughly be divided into the following three broad categories:

(1) A group which utilizes principally the time-domain properties of speech signals;
(2) A group which utilizes principally the frequency-domain properties of speech signals; and
(3) A group which utilizes both the time and frequency domain properties of speech signals.

SUMMARY OF THE INVENTION

The present compression system adopts a method which uses a pattern recognition approach for classifying a given speech segment into three classes: voiced speech, unvoiced speech and silence. The pattern recognition approach provides an effective method of combining the contributions of a number of speech measurements, which individually may not be sufficient to discriminate between the classes, into a single measure capable of providing reliable separation between the three classes. The system and method implemented herein is essentially based on the rate of the zero crossings of the speech waveform from the bit serial encoder, namely CVSD, MIMIC, or SPFE, used for digitizing the speech waveforms.

The following three measurements used in the system and method of the present invention are:
(1) The number of silent patterns (0000, 0101 or 1010) of SPFE, MIMIC, and CVSD respectively "X0".
(2) The number of one pulses in a-frame "S1".
(3) The number of one bits in a frame "S".
(4) The width of the average one pulse "S/S1".

The choice of these particular parameters is based partly on experimental evidence that the parameters vary consistently from one class to another and partly on the knowledge of the method in which voiced and unvoiced speech sounds are generated in the human vocal tract and how each of the bit serial encoders digitizes these speech sounds- The present compression system and method takes into account the changes in the speech properties during the transition from voiced to unvoiced speech and avoids segmentation in order to preserve the quality and intelligibility of the reconstructed speech. Although it was mentioned earlier that the adopted method is based partly on the rate of zero crossings of the speech waveform, from an analog point of view, it is appreciated that since the digital output of a bit serial encoder is used for classifying speech in the three classes of sounds, that the rate of the zero crossing of the speech waveform corresponds to the rate of change from a high to a low (one to zero) or vice versa in the serial bit stream of the encoder. On the other hand, the use of the digital bit stream for reliably discriminating between the three classes of sounds across a wide variety of speakers simplifies the detection mechanism. The present system and method has no need to measure the energy of the signal, largest cepstral peak, and variation of the zero-crossing count from one speaking environment to another which reflects the variable characteristics of the room noise, because the serial encoders are designed to take care of these aspects.

The pitch detection portion of the present speech compression system and method determines the pitch during a voiced frame of speech and relies on the time and frequency domain properties of the digital stream of the encoders. For this pitch detection, the measurements are zero-crossing measurements and autocorrelation measurements. The zero-crossing measurements are made by locating the large one pulses in the bit stream of the encoder, while the autocorrelation measurement is made by counting the number of one bits in a frame. The basic assumption in estimating the pitch period is that if the speech waveform is periodic in the time domain, then the digital bit stream of the encoders will consist of a series of large one pulses at the fundamental frequency and its harmonics. Thus, simple measurement can be made on the bit stream of a frame to estimate the pitch period. A voiced frame outputs a large one pulse at the fundamental frequency of the speech waveform. The pitch detector portion places pitch markers directly on the bit stream of each frame. To obtain the pitch markers of interest for each voiced frame, the pitch detector portion calculates the average width of one pulses, the location of the one pulses within the frame, the width of every one pulse, and finally the number of these one pulses. From these measurements, the pitch detector portion selects the one pulses whose width is greater than the average one pulse and accordingly saves the location of these large one pulses within the frame. The remainder of the system isolates and identifies the principal excursion cycles, i.e., those which correspond to true pitch periods. This is accomplished through a series of steps by using the range of the fundamental frequency observed in human speech and the constraint on the frame size which force the frame to have at least two pitch periods. The excursion cycles are further identified by justifying that the distance between two consecutive pitch markers, which is the estimated pitch period, is within the fundamental frequency range of human speech and does not exceed half the frame size. The pitch detector portion sorts three estimated pitch periods in ascending order and then divides them into groups. Finally, the smallest element of the largest group is the pitch period that is selected. For a silent frame, the pitch period is set equal to 8 in the preferred embodiment of the invention, because of the repetitive byte recognized in the bit stream of the bit serial encoders. For an unvoiced frame, the pitch period is set equal to the frame size due to the lack of pitch markers.

One of the unique properties of the pitch detector portion of the present invention is the usage of the digital bit stream in estimating the pitch period rather than the speech waveform. This eliminates several problems encountered by pitch detectors which use the analog speech waveform to estimate the pitch period.

The operation of the preferred embodiment will be described in conjunction with the digitally encoded word "STAY" but it will be obvious to those persons skilled in the art that this description is for example only and is not to be taken by way of limitation as to the capabilities of the present invention.

Briefly the method of the present invention is as follows: a serial bit stream of speech encoded data is stored in a temporary buffer storage before compression. A microprocessor is adapted to read the stored data in fixed length frames. Each frame is processed to classify whether the frame represents voiced, unvoiced, or a silence condition. For a voiced frame, the microprocessor detects a pitch. The bits of this voiced frame, are then compared with the bits of prior received voiced frames, on a pitch basis, so as to detect repetition. When repetition is detected, the repetition count, the pitch period, and the repetitive pitch bits are stored in another temporary storage, thereby compressing the number of bits that have to be stored and/or transmitted. The compressed information is reconstructed by utilizing a decoder which can interpret the stored information and cause reinsertion of the repetitions.

Accordingly, it is a primary object of the present invention to provide an improved system and method for compressing speech signals.

It is another object of the present invention to provide a system and a method which considers the changes in speech properties during the transition from voiced to unvoiced speech.

It is yet another object of the present invention to unlink the voiced-unvoiced decision from the pitch detection.

It is a further object of the present invention to provide a system and a method which operates upon the zero-crossings of the speech waveform from bit serial encoders.

These and other objects of the present invention will become more apparent and better understood when taken in conjunction with the following description and the accompanying drawings, through which like characters indicate like parts and which drawings form a part of this application.

BRIEF DESCRIPTION OF THE DRAWINGS

FIGS. 5A and 5B, arranged according to the map of FIG. 5, illustrate a flow chart depicting the operation of a pitch detector subassembly of FIG. 3.

FIG. 6 illustrates various types of compressed data blocks.

FIGS. 7A-7C, arranged according to the map of FIG. 7, illustrate a flow chart corresponding to the pitch interval repetition algorithm of FIG. 3.

FIGS. 9A-9D are waveforms illustrating the word "STAY" in analog form, SPFE, CVSD, and MIMIC digital form, respectively.

FIGS. 10A-10C are waveform representations of the spoken word "STAY" processed through a SPFE encoder.

FIGS. 11A-11C are waveform representations of the spoken word "STAY" processed through a CVSD encoder.

FIGS. 12A-12C are waveform representations of the spoken word "STAY"processed through a MIMIC encoder.

FIGS. 13A-13C are waveform representations illustrating pitch detection of the spoken word "STAY" for SPFE, CVSD, and MIMIC encoded voice frames, respectively.

DESCRIPTION OF THE PREFERRED EMBODIMENT

Figure 1:
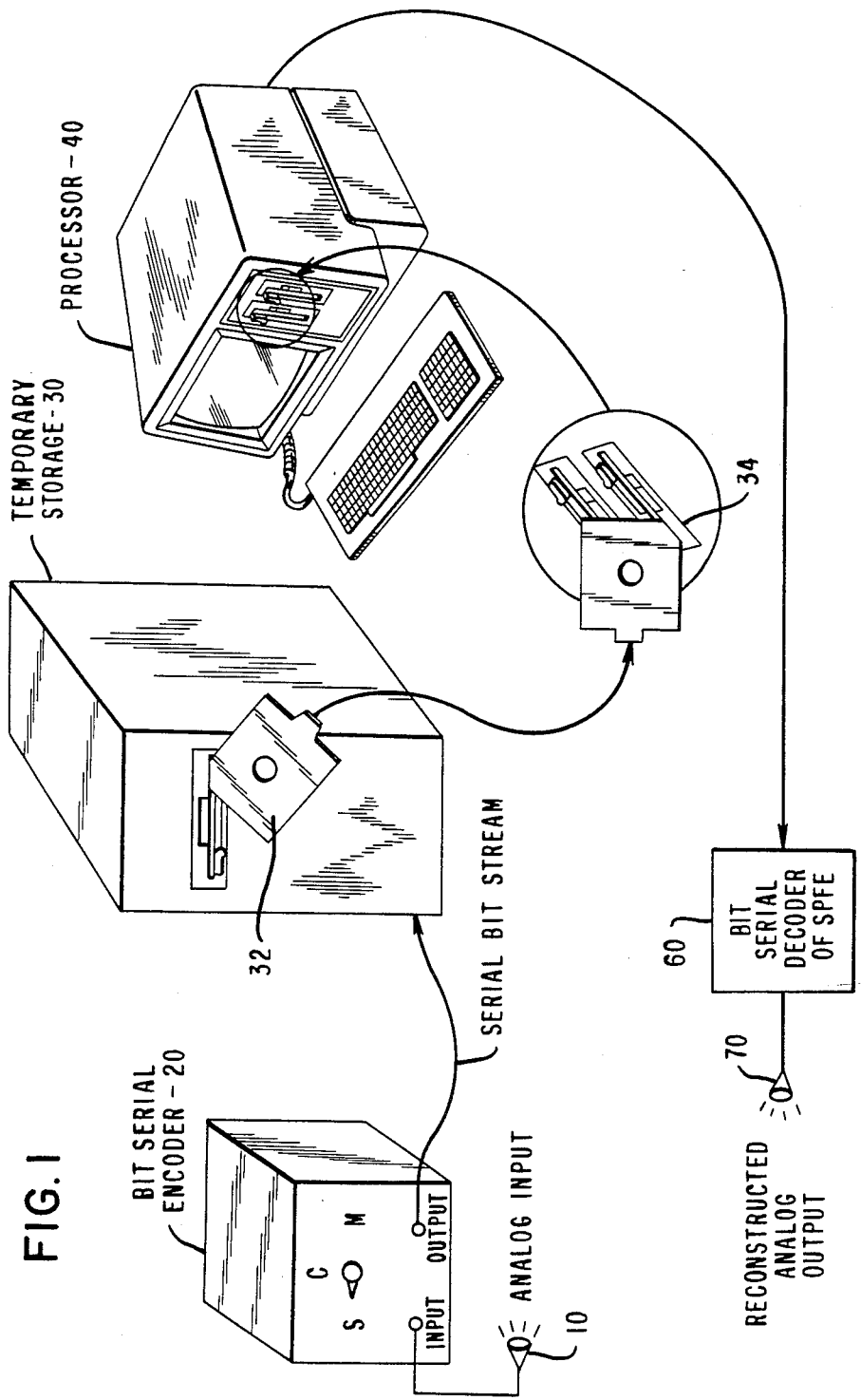
FIG. 1 illustrates in system diagram form the preferred embodiment of the present invention.

Referring to FIG. 1, a source of electrical speech signals 10, which may, for example, be a tape recorder or a microphone, is connected to deliver electrical analog speech signals to the input of a bit serial encoder (digitizer) 20. The digitizer 20 can be of a type that provides a serial bit stream using either a SPFE, CVSD, or MIMIC based system. The serial bit stream from the digitizer output is stored in a temporary storage 30. The serial bit stream may be stored on a floppy disc 32 which disc is transferred to the disk reader 34 portion of a processor 40 when read from storage is required. The processor 40 which may be an NCR Decision Mate V, operates upon the stored data to compress it, temporarily store it, and transmit it to a bit serial decoder 60. The compressed information is reconstructed into the original analog signal by the bit serial decoder 60. The analog signal from the decoder 60 is fed to an "Amplifier-Speaker unit" 70 or other applicable device for generating the reconstructed analog speech.

The processor 40 reads the original data from the temporary storage 30 in frames and processes the original data with a compression algorithm. Each of these frames have a fixed length, IW bits long. Experimentally it was determined that the frame length is dependent on the bit rate of the digitizer and should be at least two pitch periods wide where a pitch period ranges from 80 to 300 Hz.

Figure 2:
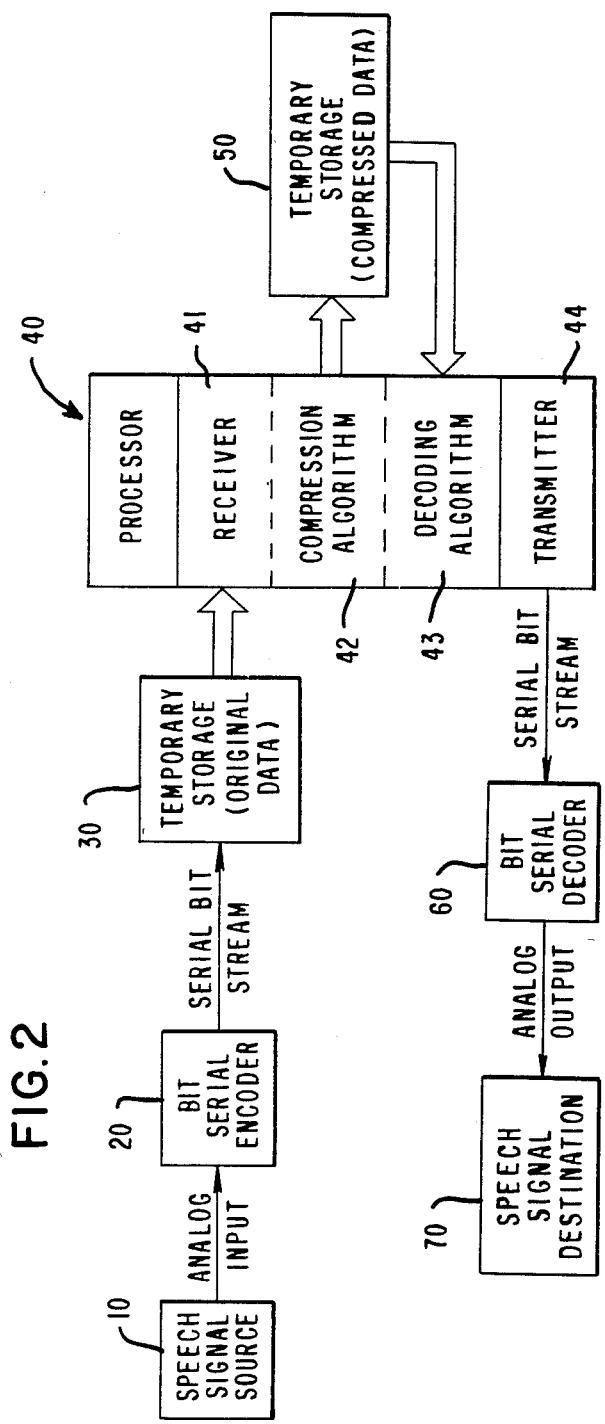
FIG. 2 illustrates the preferred embodiment of the invention in block diagram form.

Referring to FIG. 2, which is the block equivalent of the elements shown in FIG. 1; the processor 40 is comprised of a receiver 41, a compression algorithm 42, temporary storage 50, decoding algorithm 43 and transmitter 44. The receiver 41 reads the original data stored by the temporary storage subassembly 30 in fixed length and passes these frames to the compression algorithm 42. When reconstruction is desired the processor decodes the stored compressed data and transmits the decoded data as a serial bit stream to the bit serial decoder 60. Each frame is processed as an array IB[] by the compression algorithm 42 (shown in block form in FIG. 3). IB is an IW ×1 array. The process flow of the compression algorithm 42 is set out in FIGS. 4, 5A, 5B, 7A, 7B, and 7C. The operation of the compression algorithm will be described later in this section of the specification. The output of the compression algorithm is a sequence of compressed blocks, the form of which is illustrated in FIG. 6, which are stored in the temporary storage 50. Upon readout a decoding algorithm 43 (shown in block form in FIG. 8A provides a repetition reinsertion to the compressed data. The transmitter section 44 transmits the data from the decoding algorithm to the bit serial decoder 60. The process flow of the decoding algorithm 43 is set out in FIG. 8B.

Figure 3:
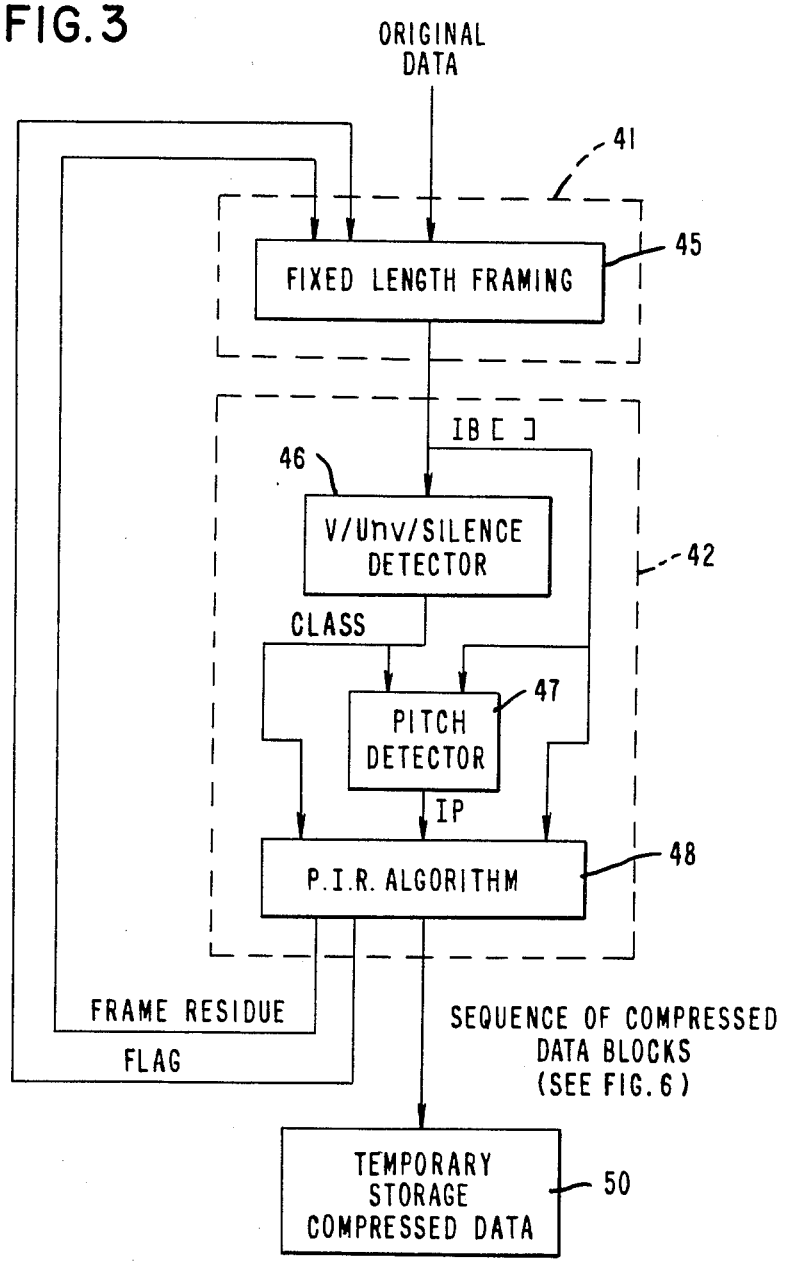
FIG. 3 is a detailed block diagram illustrating a processor encoder portion of the system of FIG. 1.

Referring to FIG. 3, original data received by the receiver 41 is formed into fixed length frames IB[] by a fixed length framing element 45. Each frame array IB[] is directed to a voiced/unvoiced/silence (V/UNV/S) detector 46, a pitch detector 47 and a pitch interval repetition (P.I.R.) algorithm 48. The V/UNV/S detector 46 functions to class each frame array IB[] by calculating a value $X_0$, where $X_0$ is equal to the number of consecutive sequences which have the patterns "0000", "0101" or "1010". These patterns have been found to repeat indefinitely in a silent frame. $X_0$ is compared against threshold values to determine the class of the frame. A silent frame is defined as CLASS 0. An unvoiced frame is defined as CLASS 1, and a voiced frame is defined as CLASS 2. The class determination is directed as inputs to the pitch detector 47 and to the pitch interval repetition algorithm 48. The pitch detector 47 uses the array IB[] to detect pitch, based on what class the frame is. A more detailed description of the operation of the pitch detector will be made with the description of the flow of FIGS. 5A and 5B. The output of the pitch detector 47 is denoted IP and is directed as an input to the pitch interval repetition algorithm 48. The P.I.R. functions to calculate a value P which equals the number of pitch periods in a frame. The P.I.R. provides as an output a frame residue signal (if any) in the frame IB[] that has not yet been compared. The residue signal is directed back as an input to the fixed length framing element 45. A FLAG signal, which is equal to 2 if the previous processed frame was voiced and is equal to 0 if it was not voiced, is also directed back as an input to the fixed length framing element 45. The P.I.R. outputs a sequence of compressed data blocks (See FIG. 6) for storage in the temporary storage for compressed data 50.

Figure 4:
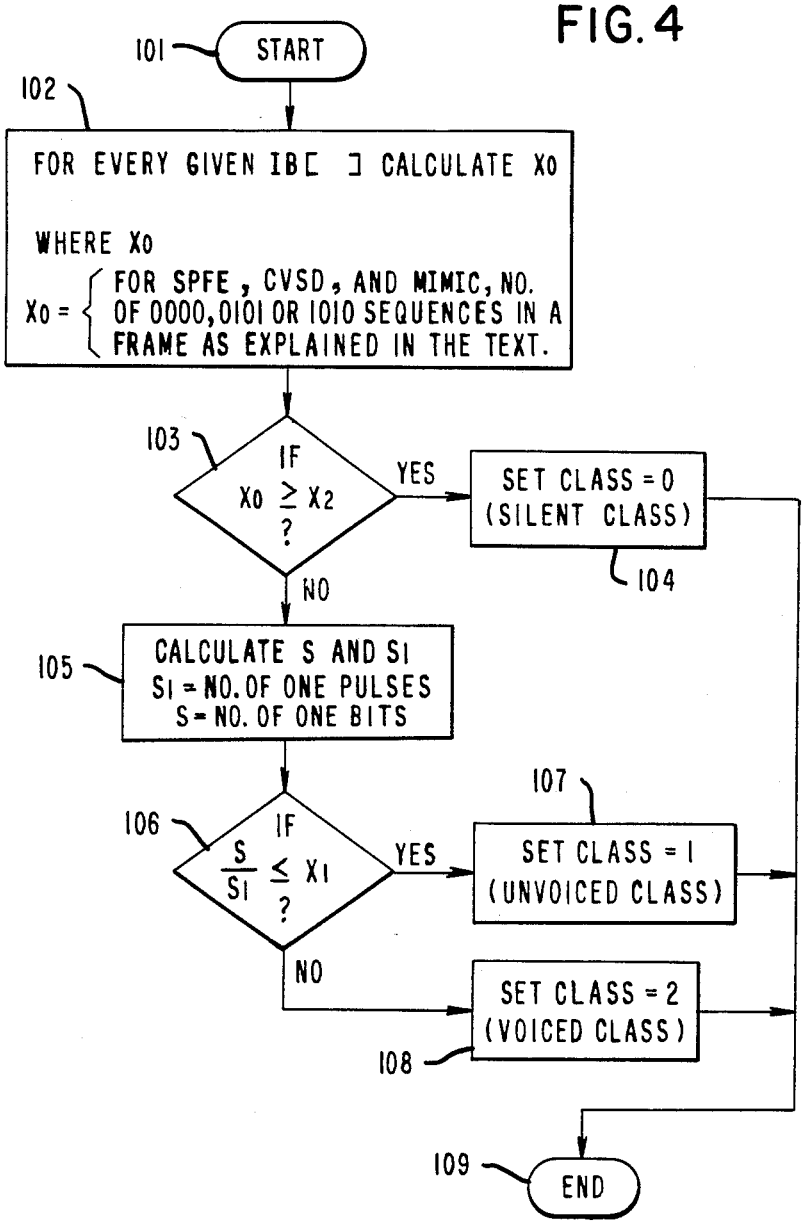
FIG. 4 is a flow chart illustrating the operation of a voiced/unvoiced detector subassembly of FIG. 3.

Referring to FIG. 4 the voiced/unvoiced silence detector 46 operates upon the array IB[] with a flow that commences with the START block 101. In block 102 the value $X_0$ is calculated for each IB[]. $X_0$ is equal to the number of "0000", "0101", or "1010" sequences in a frame. When $X_0$ is computed, a decision block 103 determines if $X_0$ is greater than or equal to a value $X_2$. If the answer is "yes" a block 104 sets the CLASS signal equal to 0. If the answer is "no" a block 105 operates to calculate S and S1 which are values representing the number of one bits and the number of one pulses, respectively, in an array IB[]. A one pulse is defined as, a pulse which has one or more consecutive one bits. A "no" decision from block 103 indicates that a frame may be voiced or unvoiced. If the ratio of S/S1 (average width of one pulse) is less than or equal to $X_1$, then the frame is unvoiced and the CLASS is set equal to 1 by block 107 otherwise the frame is voiced and the CLASS is set equal to 2 by block 108. The value $X_1$ is an unvoiced threshold level and the value $X_2$ is a silence threshold level determined empirically by examining a number of unvoiced and silence frame patterns, respectively. The flow then ends at the END block 109 with the determined CLASS signal being directed to the pitch detector 47 and the P.I.R. algorithm 48.

Figure 5B:
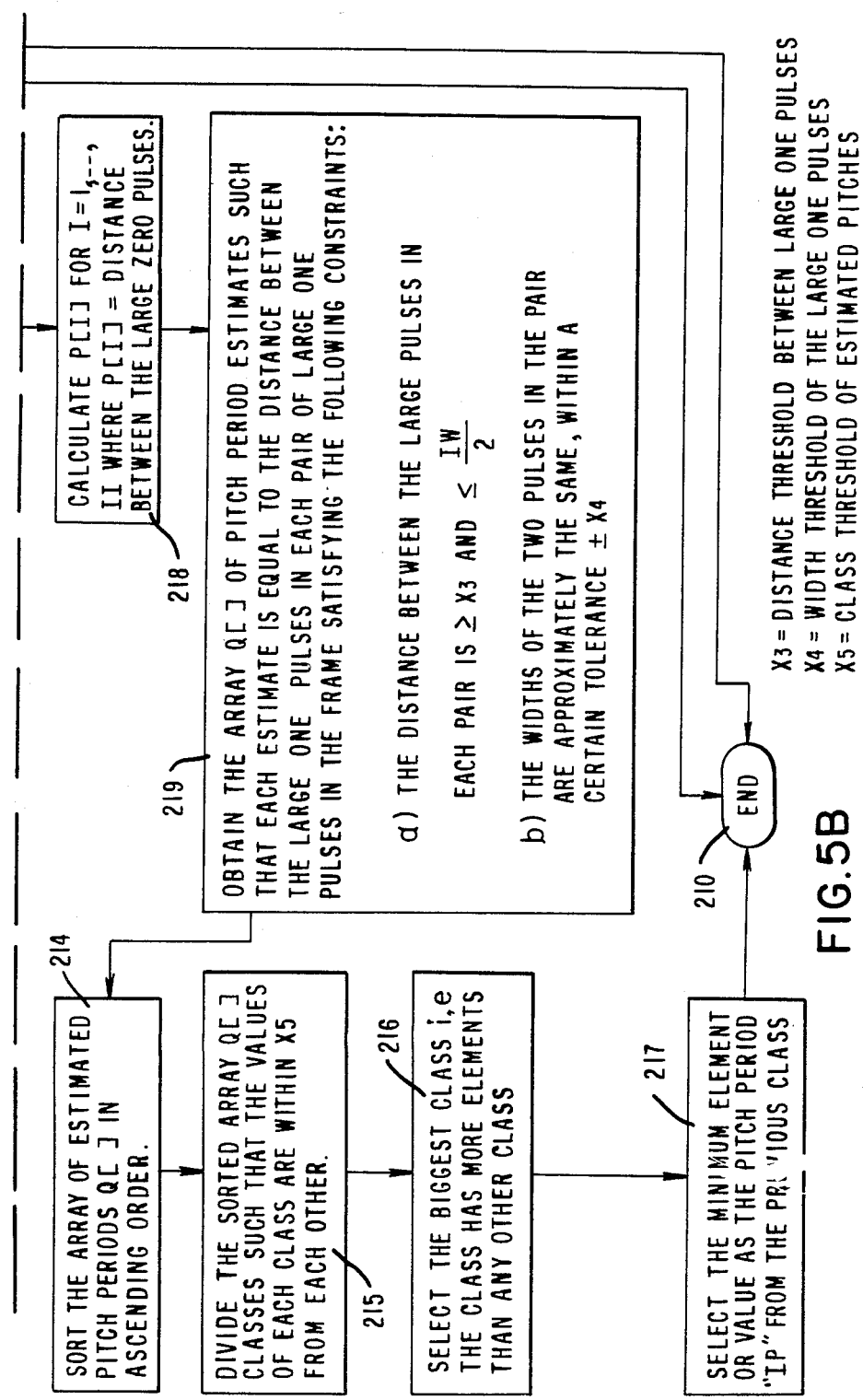

Referring to the flow of FIGS. 5A and 5B, which relates to the operation of the pitch detector 47, the flow commences at the START block 201 and moves to the decision block 202. A "yes" decision indicates that the frame is silence, CLASS=0 and a decision block 203 is entered to determine if the previous frame was voiced by noting if the FLAG is equal to 2. If the previous frame was voiced the previous pitch is left unchanged and the flow proceeds to the END block 210. If the FLAG does not equal 2 then a default pitch IP is set equal to 8 in action block 204. Referring back to the decision block 202, if the decision is "no" the CLASS is not equal to "0" and the decision block 206 is entered to determine if the CLASS is equal to 1. If the decision is "yes" a further check is made by decision block 207 to determine if the FLAG is equal to 2. If "yes", the algorithm does not change the previous pitch. If the decision is "no" (i.e., FLAG not equal to 2), the pitch IP is set equal to a frame size IW (number of the bits in a frame) by the action block 208 and is directed to the END block 210. Referring back to the decision block 206, if the frame is voiced, that is the CLASS=2, the algorithm calculates the average width of a one pulse X6 within the action block 209, and then the location of each one pulse in the frame IB[] in action block 210. An array P1[I] is then calculated in action block 211 which corresponds to the width of the one pulses. These widths are saved in the array P1[I]. At action block 212, by using the arrays P1[I], W[I], and X6, the algorithm selects only the large one pulses, and saves their locations in an array P2[J] and their widths in an array P3[] at action block 213. A large one pulse is a pulse whose width is greater than or equal to X6. By using P2[J] and P3[], the distances between the large zero pulses is calculated and saved in an array P[I] at action block 218. By using the array P[I] at action block 219, the algorithm obtains the array Q[] of pitch period estimates such that each estimate is equal to the distance between the large one pulses in each pair of large one pulses in the frame satisfying the following constraints:

(a) The distance between the large pulses in each pair is greater than or equal to X3 and less than or equal to IW/2. X3 is a distance threshold obtained empirically.

(b) The widths of the two pulses in the pair are approximately the same, within a tolerance of ±X4. X4 is a width threshold obtained empirically.

After the array Q[] is found, the algorithm sorts the entries of Q[] in ascending order at action block 214. The sorted Q[] array is divided into the defined classes at action block 215. Each class consists of values that are within X5 from each other. X5 is also an empirically determined threshold. The algorithm then selects the biggest class (i.e., the class that has the maximum number of elements) at action block 216 and picks the minimum value of this class as a pitch period estimate (IP) at action block 217. The minimum value is then directed to the END block 210 to end this portion of the flow.

Figure 7A:
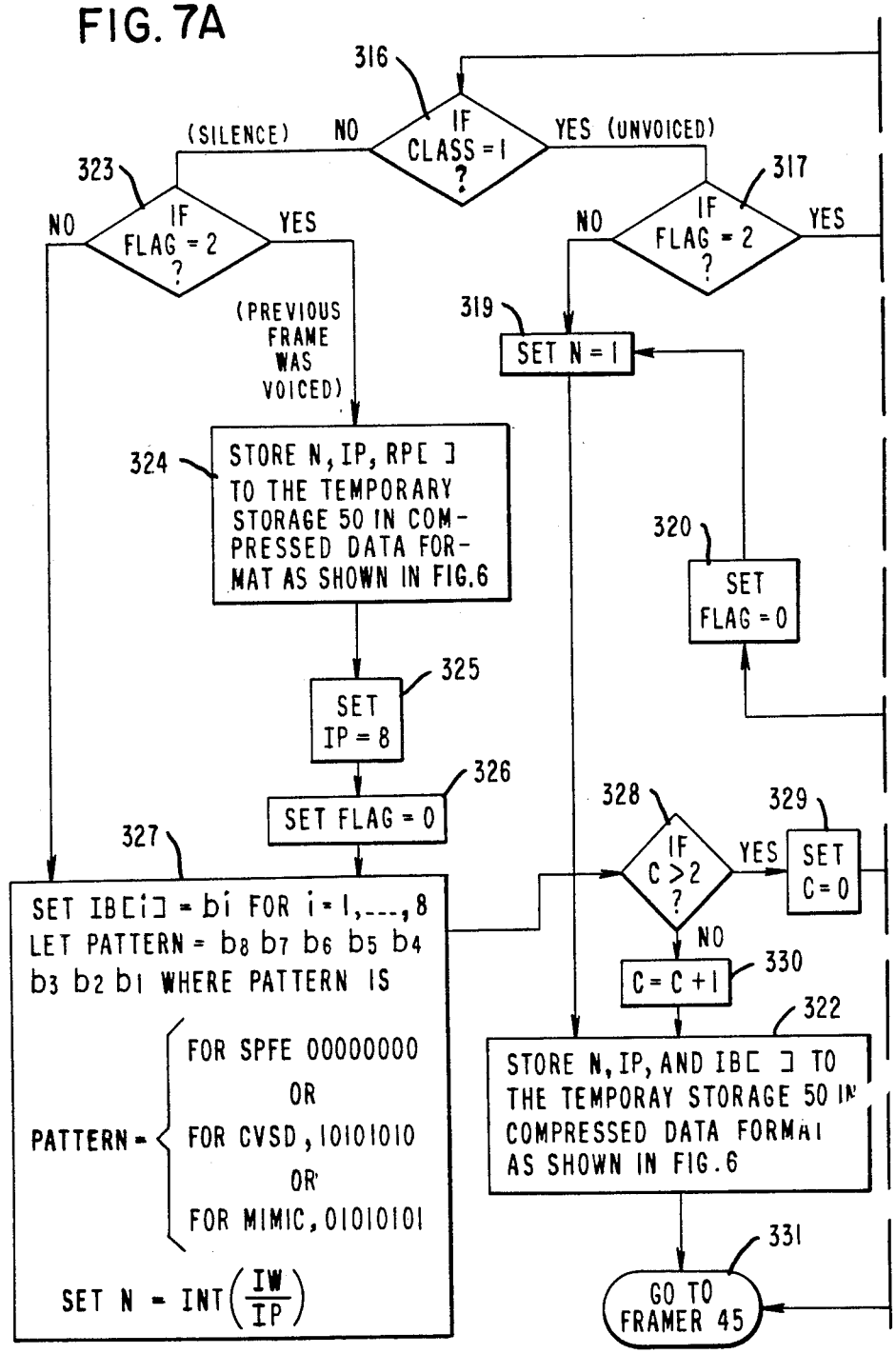
Figure 7B:
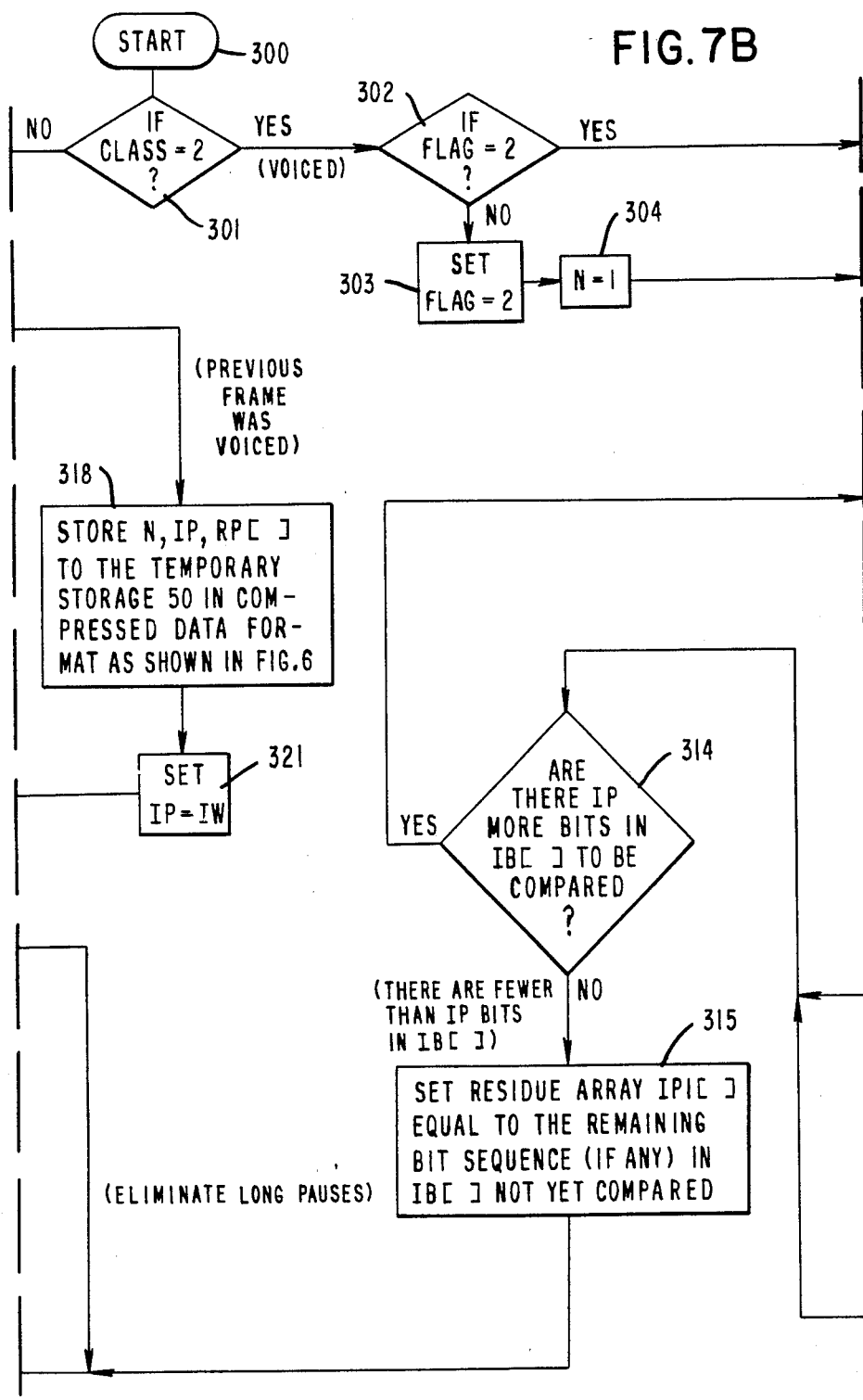
Figure 8A:
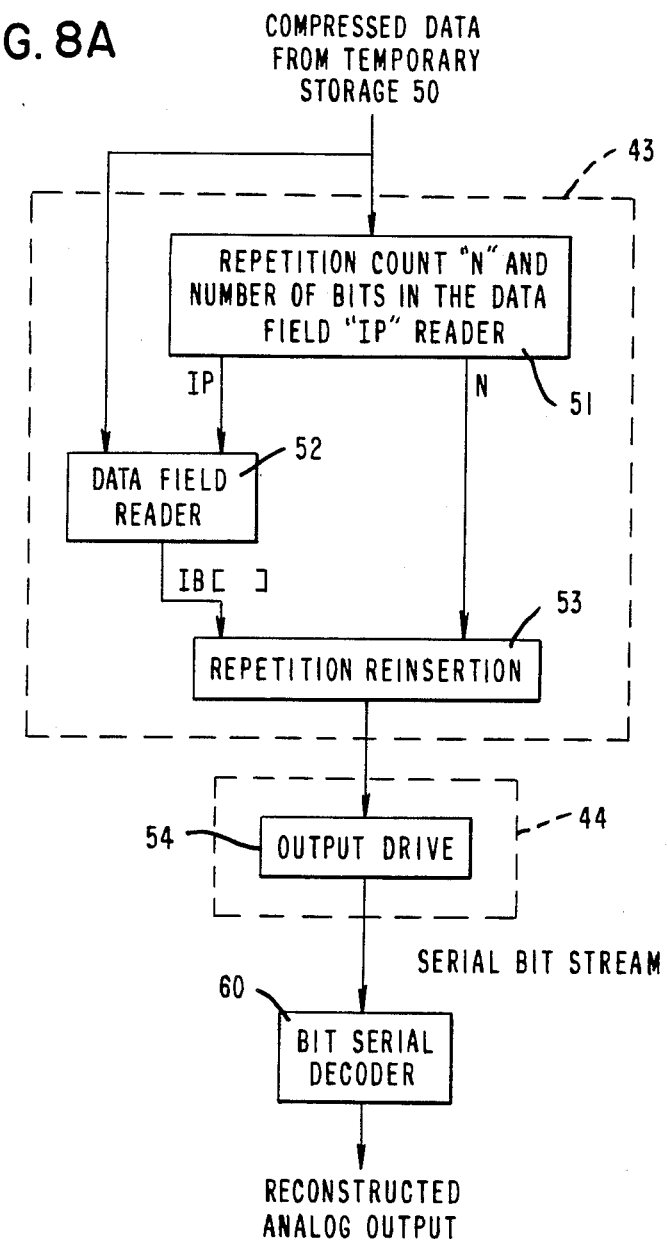
FIGS. 8A and 8B are a detailed block diagram and a flow chart, respectively, illustrating the processor decoder portion of the system of FIG. 2.

The frame CLASS and the pitch estimate IP are then fed to the P.I.R. algorithm, the flow of which is depicted in FIGS. 7A, 7B and 7C. This flow commences at the START block 300. A decision block 301 determines whether the frame is voiced (i.e., CLASS=2) or not. If "yes", a determination is made, at decision block 302, as to whether the previous frame was voiced (i.e., the FLAG=2) or not. If "no", action block 303 sets the FLAG =2 and at action block 304, N is set equal to 1 and the flow moves to action block 305 wherein the value P is calculated. The value N is a repetition count corresponding to the number of times that data will be repeated on reconstruction and the value P equals the number of pitch periods in the frame being processed. An array RP[], corresponding to the first IP bits of the frame IB[], is chosen by action block 306 as the reference pitch period pattern. At action block 307 the RP[] pattern is compared with the bit pattern in the next group of IP bits in IB[]. The comparison is done on a bit-by-bit basis in a continuous order starting from the first bit in RP[] and the first bit in the group being compared. A value, SS, is set equal to the number of bits that do not match in the previous comparison. The value N is checked at decision block 308 to determine whether it is greater than or equal to 255. If "yes" (i.e., N >=255), the algorithm at action block 311 stores the values of N, IP, and RP[] in the temporary storage 50 in compressed data format as shown in FIG. 6. Then, at action block 312, N is set equal to 1 and at action block 313 the RP[] pattern is set equal to the last compared group of IP bits in IB[]. If N is less than 255, the algorithm at decision block 309 compares whether SS is less than or equal to XN, where XN is an acceptable matching bit thresholds and if the answer is "no", then the same sequence of events, as when N is greater than or equal to 255, is executed. If the answer is "yes" that is SS <=XN, the algorithm at action block 310 increments N by 1 and directs the flow to decision block 314. At decision block 314, if there are more IP bits in IB[] to be compared, the algorithm flows back to action block 307 to compare the current RP[] with a group of IP bits of IB[] that have not yet been compared and continues the same checking as described above. If the decision is "no" (i.e., no more IP bits left in IB[]), then IP1[], at action block 315, is set equal to the frame residue, that is, to the remaining bit sequence (if any) in IB[] not yet compared. Finally the algorithm goes back to the fixed length framer 45. Returning to the decision block 302, if a class is voiced and the previous frame is voiced (i.e., CLASS=2 and FLAG=2), then the algorithm jumps to action. block 307 for the comparison of RP[] and the next group of IP bits in IB[] and the same flow of events (as before) are executed thereon.

Referring back to decision block 301, if the frame is not voiced (i.e., CLASS is not equal to 2), the flow is directed to decision block 316 to determine if the frame is unvoiced (i.e., CLASS=1) or silence (i.e., CLASS=0). If the frame is unvoiced, the flow is directed to a decision block 317 to determine if the previous frame was voiced (i.e., FLAG=2). If "yes", the algorithm stores N, IP, and RP[] in the temporary storage 50, in compressed data format, at action block 318, and sets, IP equal to IW at action block 321. IW equals the number of bits in a frame. The FLAG is set equal to 0 at action block 320 and is set equal to 1 at action block 319. If the decision, at decision block 317, is "no", (FLAG not equal to 2), then the main unvoiced stream of processing starts at action block 319 by setting N equal to 1 and proceeds to storing N, IP, and IB[] in the temporary storage 50 in compressed data format at action block 322. If the frame is not unvoiced (i.e., CLASS not equal to 1), then the frame must be silence (i.e., CLASS=0) as determined by decision block 316. For a silence frame, the algorithm checks at decision block 323 to determine whether the previous frame is voiced (i.e., FLAG=2 ), if "yes", it stores, at action block 324, the values of N, IP, RP[] in the temporary storage 50, in compressed data format, and sets IP equal to 8 at action block 325 and the FLAG equal to 0 at action block 326. The flow then merges to the main silent stream of processing at action block 327. If the decision, at decision block 323 is "no", (i.e., FLAG not equal to 2 ) then the main silent processing flow starts by setting IB[i] equal to $b_i$ for i=1, 2, ..., 8. The pattern, $b_8$ $b_7$ $b_6$ $b_5$ $b_4$ $b_3$ $b_2$ $b_i$, was determined empirically to repeat itself indefinitely for the entire silent frame.

After IB[i] is set, the algorithm sets N equal to the integer part of the ratio IW/8 so that the pattern, $b_8 b_7 b_6 b_5 b_4 b_3 b_2 b_l$, is repeated N times. The flow then moves to decision block 328 to determine if C is greater than 2. If "no", C is incremented by 1 at action block 330 and the flow is directed to action block 322 for storing the value of N, IP and IB[] in the temporary storage 50 in compressed data format, and from there the flow goes back to the framer 45. If the decision at decision block 328 is "yes", (i.e., C<=2), the algorithm sets C equal to 0 at action block 329 and then goes to the framer 45. The value C is a count of the consecutive silent frames and is set equal to 1 when the first frame is read. This count does not allow the algorithm to store more than three consecutive silent frames. The silent criteria of the pitch interval repetition is added to the algorithm to remove pauses between words or sentences.

Referring now to FIG. 8A, the decoder reads the compressed data from the temporary storage 50 in the order they were stored. First, in block 51, the repetition count N is read from the first byte of the bits. Second, in block 51, IP in the data field, is read from the second byte. Thirdly, the data fields are read, at the data field reader 52, from the third byte up till the nth byte. This information is used at block 53 to repeatedly reinsert the IP bits in the data field N times resulting in an expanded data format. This expanded data format or serial bit stream is fed to an output drive 54 which is part of the transmitter 44 for transmitting the bit stream to the bit serial decoder 60 for playback. This process of repetition, reinsertion, transmission, and playback of the compressed data is repeated until all of the compressed data, stored in the temporary storage 50, is processed.

Figure 8B:
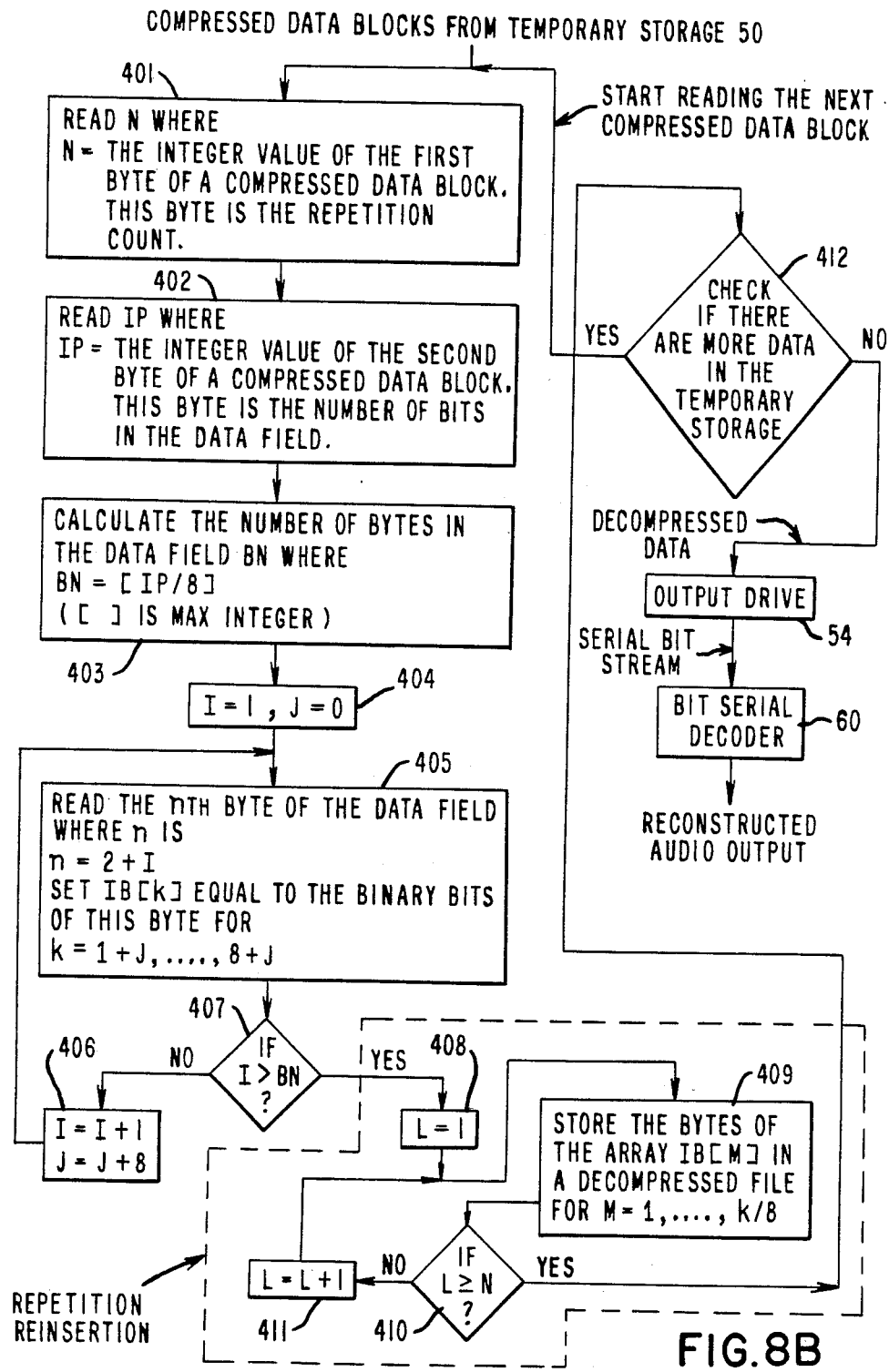

Referring to FIG. 8B, the compressed data blocks from the temporary storage 50 are read out, one at a time, with action block 401 reading the value of N from first byte of compressed data. The action block 402 then reads the value IP from the second byte of compressed data. The number of bytes in the data field BN is determined in action block 403. Counter variables I and J are set equal to 1 and 0, respectively, in action block 404. The action block 405, decision block 407, and count incrementer block 406 operate as a "D0-loop" which continues to repeat the action of action block 405 until I is greater than BN. When that condition is reached, an L counter block 408 is set equal to 1 and, action block 409 stores the bytes of the array IB[M] in a decompressed file. The value L is checked at decision block 410 to determine whether it is greater than or equal to N (repetition count). The L counter 411 is incremented by 1 for each "no" answer from decision block 410. If the decision is "yes" a check is made, at decision block 412, to determine if there are any more compressed data blocks in the temporary storage 50. If the answer is "yes", action block 401 starts reading the next compressed data block. If the answer is "no", the decompressed data is directed to the output drive 44 and the bit serial decoder 60. In the preferred embodiment of the invention the output drive 44 is coupled to the bit serial decoder 60 by a Centronics parallel printer I/0 port (not shown for simplicity). The output drive reads the file generated by the repetition reinsertion block 409 and transfers the data to the bit serial decoder 60.

TABLE 1

| Encoders | Experimental Thresholds | | | | |
|---|---|---|---|---|---|
| | X1 Unvoiced Threshold | X2 Silence Threshold | X3 Distance Threshold | X4 Width Threshold | X5 Class Threshold |
| CVSD | R/4.0 | 0.225 (IW) | R/300 | 1 | 8 |
| MIMIC | R/4.8 | 0.225 (IW) | R/300 | 1 | 5 |
| SPFE | R/4.8 | 0.225 (IW) | R/300 | 1 | 5 |

The above table sets forth the experimental threshold levels for three different digitizers that can be used in this compression system. Note that XN (matching threshold) was not included in the table because XN can be set equal to 10, 15 or 20 depending on the compression factor needed and the speech quality desired by the user.

DETERMINATION OF THE EXPERIMENTAL THRESHOLDS FOR THE SILENCE DETECTOR AND PITCH DETECTOR

Referring now to FIG. 9A, the analog signal representation of the spoken word "STAY" is shown divided into its unvoiced, silence and voiced portions. The voiced portion is seen to contain the largest amplitude variations as compared to the other portions.

FIGS. 9B, 9C and 9D illustrate the serial bit stream appearing at the output of a SPFE, CVSD and MIMIC encoder, respectively when the signal of FIG. 9A is applied to their inputs.

The voiced/ unvoiced/ silence detector 46 and the pitch detector 47 parameters were determined by analyzing the bit pattern of several speech waveforms which were digitized by different encoders, namely SPFE, CVSD, and MIMIC. The analysis was conducted for different speakers and bit rates (9.6, 16 and 40 Kbit/sec). The pattern analysis was performed by using a digital Sona-Graph for displaying the speech waveforms and the corresponding bit patterns of these speech signals, and measuring the following parameters:

(1) Experimental unvoiced threshold "X1":

After investigating the bit pattern of voiced frames versus unvoiced frames, it was found that the serial bit streams of each encoder during an unvoiced frame changes from high to low (i.e one to zero or vice versa) more rapidly than the serial bit stream of a voiced frame. This criteria of unvoiced frames imposed a restriction on the width of the one pulses. From this restriction the unvoiced threshold "$X_1$" was determined as a powerful parameter for discriminating between a voiced frame and an unvoiced frame. This characteristic of unvoiced frames is justified by the fact that unvoiced sounds are generated when the vocal cords are not vibrating and its energy spectrum looks like the spectrum of broadband white noise. These criteria cause several zero crossing in the speech waveform of an unvoiced frame. Consequently, the digital output of SPFE, CVSD, and MIMIC will consist of short duration one pulses.

FIGS. 10A–10C, 11A–11C and 12A–12C, show typical silent, unvoiced, and voiced frames for SPFE, CVSD, and MIMIC respectively. These figures represent a greatly expanded view of the signals shown in FIGS. 9A to 9D. The 1 labeled figures correspond to the like labeled analog portion of FIG. 9A, while the 2 labeled figures correspond to the like related digital portions of the encoder serial bit stream. Referring now specifically to FIGS. 10A-10C, 11A-11C and 12A-12C, it is obvious that the bit pattern of the unvoiced frame can be discriminated from that of a voiced frame by using $X_1$. The following table lists the variations of $X_1$ for different speakers and different bit rates.

TABLE 2

| Speakers: | Time Duration Range of $X_1$ | |
| --- | --- | --- |
| F1: Female (No. 1) | 0.10 to 0.20 msec | |
| F2: Female (No. 2) | 0.104 to 0.205 msec | |
| M1: Male (No. 1) | 0.10 to 0.201 msec | |
| M2: Male (No. 2) | 0.103 to 0.208 msec | |
| | Width of X1 in Bits at 9.6 Kbps | Width of X1 in Bits at 16 Kbps | Width of X1 in Bits at 40 Kbps |
| F1: | 1 to 2 bits | 2 to 4 bits | 4 to 8 bits |
| F2: | 1 to 2 bits | 2 to 4 bits | 4 to 8 bits |
| M1: | 1 to 2 bits | 2 to 4 bits | 4 to 8 bits |
| M2: | 1 to 2 bits | 2 to 4 bits | 4 to 8 bits |

(2) Silence Threshold level "$X_2$":

This parameter is determined by analyzing the bit patterns of silent frames versus those of unvoiced frames by using the same equipment mentioned previously. It was found that SPFE outputs a train of zeros for silent frames, while CVSD and MIMIC output a train of 0101 or 1010 for silent frames. This observation was carried on to investigate the nebel pattern (1 nebel = 4 bits) during the transition between a silent frame and an unvoiced frame. After investigating these nebel patterns, it was concluded that if the number of repetitive nebels for each encoder exceeds 90% of the total number of nebels in a frame, then that frame was called a silent frame. The parameter $X_2$ is independent of the bit rate but depends on the frame size (IW) as indicated in TABLE 1.

Therefore, the voiced/unvoiced/silence detector 46 uses $X_2$ to first discriminate between a silent frame and an unvoiced frame and then uses $X_1$ to discriminate between an unvoiced frame and a voiced frame. If these tests fail then the frame is voiced.

(3) Distance Threshold between large one pulses "$X_3$":

The distance threshold between large one pulses "$X_3$" was determined by measuring the pitch contour variation for different speakers. These measurements were accomplished by correlating the bit stream of each encoder to the speech waveform during a voiced sound frame. Extensive analysis of the voiced sounds have shown that in producing a voiced sound the vocal cord produces small puffs of air, the repetition rate of which establishes the fundamental frequency. That repetition rate depends primarily upon the mass, length, and elasticity of folds in the vocal cords of the individual. Consequently, the pitch of a speaker, is normally fixed in the range from about 50 Hz for men to about 300 Hz for women. This pitch range produces upper and lower limits for the pitch period. The lower limit of the pitch period is used to calculate $X_3$ as follows:

$$X_3 = \text{Bit rate} \times (1/300)$$

Since the pitch period in the study is equal to the number of bits between two large one pulses, then $X_3$ is the minimum pitch period (i.e., the minimum number of bits). The upper limit of the pitch period ( 80 Hz) and the pitch detection method used in this system have imposed a constraint on the frame size. This constraint is that the frame size (IW) has to be at least two pitch periods wide. The frame size is calculated as follows:

$$IW = [\text{bit rate} \times (1/80)]0.2$$

Half frame size and $X_3$ were used in the pitch detection algorithm as an upper bound and a lower bound on the detected pitch periods as shown in FIGS. 13A-13C. TABLE 3 shows the pitch variation for each of the speakers used in this analysis.

TABLE 3

| Speakers: | Pitch Period Range |
| --- | --- |
| F1: Female (No. 1) | 3.3 to 4.5 msec |
| F2: Female (No. 2) | 3.8 to 5.1 msec |
| M1: Male (No. 1) | 6.5 to 10.8 msec |
| M2: Male (No. 2) | 7.8 to 12.5 msec |

(4) Width Threshold of the large one pulses "$X_4$":

This parameter was determined by comparing the widths of the large one pulses at the start and the end of pitch periods as shown in FIGS. 13A-13C. By analyzing several pitch contours, it was found that these pulses have approximately equal duration. This observation is justified by referring to FIGS. 13A-13C. When the speech waveform is increasing, CVSD and MIMIC output a train of ones until the waveform reaches the peak while SPFE outputs a train of ones as long as the waveform is above the axis. On the other hand, since pitch period is located between two major peaks or minor peaks which have equal amplitudes then the large one pulses, corresponding to these peaks should have equal width. This aspect of the pitch period allows a tolerance called $X_4$.

(5) Class Threshold of estimated pitch period "$X_5$":

This parameter was determined by investigating the pitch period variations between consecutive voiced frames for many speakers. It was found that the pitch period can vary from 0.3 to 0.5 msec. This range determines $X_5$ as follows:

$$X_5 = \text{Bit rate} \times 0.5$$

The upper limit was chosen because it was the worst case determined in the pitch contour variation.

While there has been shown what is considered to be the preferred embodiment of the invention, it will be manifest that many changes and modifications may be made therein without departing from the essential spirit of the invention. It is intended, therefore, in the annexed claims, to cover all such changes and modifications as fall within the true scope of the invention.

I claim:

1. A method for compressing a serial bit stream of speech encoded data for storage and transmission comprising the steps of:
   (a) storing the bits of said serial bit stream;
   (b) reading the stored bits in fixed length frames;
   (c) processing each frame of read bits to classify the frame as voiced, unvoiced or silence;
   (d) determining the pitch for a frame classified as voiced;
   (e) comparing, on a pitch basis, the bits of the present voiced frame with the bits of the preceding voiced frames to detect repetition;

(f) temporarily storing the repetition count, the pitch period, and the repetitive pitch bits; and (g) repeating steps (b) through (f) to compress the serial bit stream that is temporarily stored.

2. The method according to claim 1 and further comprising the step of:

reconstructing the serial bit stream from the temporarily stored repetition count pitch period, repetitive pitch bits and the bits of the unvoiced and silence frames.

3. The method according to claim 1 and further comprising the steps of:

(a) reading the temporarily stored repetition count, the pitch period, and the repetitive pitch bits; and (b) repeating the repetitive pitch bits the number of times corresponding to the repetition count to reconstruct said serial bit stream 4. The method according to claim 1 wherein the pitch is determined by the steps of:

(a) calculating the width of one pulses;

(b) calculating the average width of one pulses in a fixed length frame;

(c) calculating the location of one pulses;

(d) calculating the number of one pulses;

(e) selecting the large one pulses whose width is greater than the average width of one pulses;

(f) determining the distance between the large one pulses, (g) sorting, in ascending order, the large one pulses in pairs according to the distance between the large one pulses;

(h) forming classes of pitch periods by placing in each class all large one pulses that are within a fixed threshold of each other; and (i) selecting the distance of the closest spaced pair of large one pulses from the class having the greatest number of large one pulses as the determined pitch.

5. A method for compressing a serial bit stream of speech encoded data for storage and transmission comprising the steps of:

(a) storing the bits of said serial bit stream;

(b) reading the stored bits in fixed length frames;

(c) processing each frame of read bits to classify the frame as voiced, unvoiced or silence;

(d) compressing the bits of a silent frame by storing one of the repeating bit patterns and a number corresponding to the number of times the bit pattern repeats in a frame;

(e) compressing the bits of a voiced frame;

(f) comparing, on a pitch basis, the bits of the present voiced frame with the bits of the preceding voiced frames to detect repetition;

(g) temporarily storing the repetition count, the pitch period, and the repetitive pitch bits; and (h) repeating steps (b) through (g) to compress the serial bit stream that is temporarily stored.

6. A system for compressing a serial bit stream of speech encoded data comprising:

storage means for temporarily storing the serial bit stream of speech encoded data;

receiver means operatively coupled to said storage means for reading the serial bit stream from said storage means in fixed length frames;

compression means coupled to said receiver means for classifying each frame as voiced, unvoiced or silence and for compressing a voiced frame by recording the number of times that a pitch occurs in each preceding frame and the pattern of the repetitive bits;

second storage means for temporarily storing the compressed frames from said compression means; and decoding means coupled to said second storage means for decompressing the compressed frames to reconstruct said serial bit stream of speech encoded data.

7. The system according to claim 6 wherein said compression means is comprised of:

detector means for classifying each frame of said serial bit stream as voice, unvoiced or silence;

pitch detector means for determining the pitch of a voiced frame by comparing the pitch of a present frame against the pitch of preceding voiced frames and providing a compressed data frame of bits indicative of the number of times the data repeats the pitch period of the data and the data itself and the pitch of the unvoiced and silence frames; and a pitch interval repetition means coupled to said detector means and said pitch detector means for organizing the storage of compressed data in serial frames and for outputting said frames in serial order to said second storage means.

8. The system according to claim 7 wherein said detector means is comprised of:

means for detecting the number of bit sequences 0000, 0101 or 1010 in a fixed length frame and for classifying the frame as silent if the number of sequences exceeds a predetermined threshold; and means for calculating the number of one pulses and the number of one bits in the frames not classed as silent such that if the number of one bits divided by the number of one pulses is less than a second predetermined threshold the frame is classed as unvoiced and if greater the frame is classed as voiced.

9. The system according to claim 6 wherein said decoding means is comprised of:

repetition count means coupled to said second storage means for reading the number of times that a pitch occurs in a frame and the number of bits in a frame;

data field reader means coupled to said second storage means and to said repetition count means to provide the sequence of data bits sorted in said second storage means as a function of the number of times that a pitch occurs from the repetition count means; and repetition reinsertion means responsive to said data field reader means and said repetition count means for reconstructing the encoded serial bit stream of said speech encoded data.

10. The system according to claim 6 and further comprising:

output drive means coupled to said decoding means for driving said serial bit stream encoded data signal; and a bit serial decoder for receiving the signal from said output drive means and for providing a reconstructed analog output signal corresponding to the speech encoded data.

* * * * *